(12) United States Patent
Carrión González et al.

(10) Patent No.: US 11,863,106 B2
(45) Date of Patent: Jan. 2, 2024

(54) POWER SUPPLY CONTROL CIRCUITS FOR BRUSHLESS DC (BLDC) MOTORS

(71) Applicant: MAHLE INTERNATIONAL GMBH, Stuttgart (DE)

(72) Inventors: Juan Carrión González, Alboraya (ES); Carlos Domingo Màs, Requena (ES); Juan Francisco Pardo Peris, Xativa (ES); Carlos Sevilla Pavon, Valencia (ES); Carlos Vernich Gimeno, Valencia (ES)

(73) Assignee: Mahle International GmbH, Stuttgart (DE)

(*) Notice: Subject to any disclaimer, the term of this patent is extended or adjusted under 35 U.S.C. 154(b) by 0 days.

(21) Appl. No.: 17/377,156

(22) Filed: Jul. 15, 2021

(65) Prior Publication Data

US 2021/0344290 A1 Nov. 4, 2021

Related U.S. Application Data

(63) Continuation of application No. PCT/EP2020/050495, filed on Jan. 10, 2020.

(30) Foreign Application Priority Data

Jan. 15, 2019 (EP) .................................... 19382023

(51) Int. Cl.
*H02M 7/5387* (2007.01)
*H02P 6/14* (2016.01)
*G01R 19/25* (2006.01)

(52) U.S. Cl.
CPC ............ *H02P 6/14* (2013.01); *G01R 19/2513* (2013.01)

(58) Field of Classification Search
CPC . G01R 19/0092; G01R 19/2513; H02P 27/06; H02P 6/14
(Continued)

(56) References Cited

U.S. PATENT DOCUMENTS 8,644,038 B2 2/2014 Sasaki
8,861,232 B2 10/2014 Ikeda et al.
(Continued)

FOREIGN PATENT DOCUMENTS

CN 102455382 A 5/2012
CN 202260404 U 5/2012
(Continued)

OTHER PUBLICATIONS

European Search Report dated Jul. 1, 2019 of European counterpart application No. EP19382023.
(Continued)

*Primary Examiner* — Muhammad S Islam
(74) *Attorney, Agent, or Firm* — Ewers IP Law PLLC; Falk Ewers

(57) ABSTRACT

A power supply control circuit of a three-phase brushless DC (BLDC) motor is provided. The control circuit includes means for calculating the DC current consumption $I_S$ based on a phase current signal $I_{shunt}$ of the BLDC motor, the means including a shunt resistor $R_{shunt}$, an amplifier and a low pass filter. The amplifier is configured to amplify a measured voltage $V_{shunt}$ that corresponds to the current $I_{shunt}$ across the resistor $R_{shunt}$ and perform an offset correction. The low pass filter is configured to provide a filtered voltage $V_O$ of the voltage $V_{shunt}$. The DC current $I_S$ is calculated based on the voltage $V_O$.

4 Claims, 5 Drawing Sheets

(58) Field of Classification Search
USPC .................................................. 318/400.01
See application file for complete search history.

(56) References Cited

U.S. PATENT DOCUMENTS

| | | | |
|---|---|---|---|
| 9,263,982 | B2 | 2/2016 | Gebregergis et al. |
| 9,985,552 | B2 * | 5/2018 | Ikarashi ................ H05K 7/209 |
| 10,547,265 | B2 | 1/2020 | Kim |
| 10,658,946 | B2 | 5/2020 | Lee et al. |
| 2012/0163046 | A1 * | 6/2012 | Hibino .................... H02P 27/08 |
| | | | 363/37 |
| 2017/0163199 | A1 * | 6/2017 | Park ........................ H02P 21/18 |
| 2019/0157994 | A1 * | 5/2019 | Prabhala .................. H02P 6/15 |

FOREIGN PATENT DOCUMENTS

| | | |
|---|---|---|
| CN | 104079229 A | 10/2014 |
| CN | 108964541 A | 12/2018 |
| CN | 110320396 A | 10/2019 |
| EP | 2420850 A1 | 2/2012 |
| JP | 4557085 B1 | 10/2010 |
| JP | 2420850 * | 2/2012 |

OTHER PUBLICATIONS

International Preliminary Report on Patentability dated Apr. 29, 2021 of International application PCT/EP2020/050495 on which this application is based.

Office Action and Search Report dated Nov. 24, 2021 in Chinese counterpart application No. 202080009288.2 and English-language translation thereof.

\* cited by examiner

POWER SUPPLY CONTROL CIRCUITS FOR BRUSHLESS DC (BLDC) MOTORS

CROSS REFERENCE TO RELATED APPLICATIONS

This application is a continuation application of international patent application PCT/EP2020/050495, filed Jan. 10, 2020, designating the United States and claiming priority to European patent application 19382023.0, filed Jan. 15, 2019, and the entire content of both applications is incorporated herein by reference.

TECHNICAL FIELD

The present disclosure relates to power supply control circuits for BLDC motors having means to calculate a DC current consumption of the BLDC motor based on the processing of a phase current signal of the BLDC motor.

BACKGROUND

The BLDC motor is becoming increasingly popular in sectors such as automotive (particularly electric vehicles (EV)), heating, ventilation, and air conditioning (HVAC), in white goods and industrial goods because it does away with the mechanical brush used in traditional motors. This characteristic makes the BLDC motors more reliable and increases its service life.

Another advantage of a BLDC motor is that it can be made smaller and lighter than a brush type motor with the same power output, making the BLDC motors suitable for applications where space is tight.

The microcontroller of the control circuit of the BLDC motor may be configured to energize the stator coils of the BLDC at the correct moment by implementing a control algorithm. Precise timing allows for accurate speed and torque control, as well as ensuring the BLDC motor runs at peak efficiency. In this respect, the microcontroller may receive system current values as inputs and signals from position sensors (as e.g., hall sensors that indicate the position of the motor rotor) to implement the control algorithm.

Current values can be measured and used as input for the control algorithm implemented by the microcontroller: Precise motor control performed by the control circuit of the BLDC represents a very significant condition for the correct performance of the BLDC motor. Whether for electronic power steering, electronic stability control, automatic braking systems, or for the self-driving vehicle, precise motor control may be required to ensure safe and efficient operation. Hence, currents can be measured to collect information primarily on the motor torque as the current measurements can be directly proportional to the motor torque.

Current measurements can also be used to determine the speed at which the motor is turning. Such speed information can be calculated by understanding how the control algorithm affects the current level applied in the BLDC motor. In this respect, the measurement of phase motor currents may be required as an input variable for the control algorithm implemented by the microcontroller. Therefore, the precise measurement of the phase motor currents can improve the motor control solution.

Furthermore, currents can be measured for fault protection: Current measurements may be used to detect when an overcurrent condition occurs allowing the system to take action to prevent a potential damage in the BLDC motor.

Current brushless DC motor control circuits may include 1 to 3 shunt resistors to measure the phase current that can be used as input for the control algorithm implemented by the microcontroller. Some algorithms may require the measurement of the DC current consumption $I_S$. In order to measure the current $I_S$, an additional shunt 101, 102 can be included either in the positive battery input A or in the battery return B (i.e., in the DC link) as shown in FIG. 1 that represents a conventional power supply control circuit 100 of a BLDC motor. However, the type of shunt resistors 101, 102 imply additional unwanted power consumption and heat dissipation in the system.

Furthermore, the power supply control circuit 100 of FIG. 1 can comprise a DC source 105, an input AC filter 103, in particular a LC filter, a microcontroller/PWM block 110 that represents a pulse width modulation PWM generator that generates a PWM signal to a three-phase inverter 120 and a microcontroller implementing a control algorithm that controls the input current in the brushless DC motor 130. The three-phase inverter 120 comprises six switches for high-power switching to feed current to the DC motor 130. Hence, the output from the block 110 comprises pulse width modulated PWM signals that determine the average voltage and average current applied to the three coils of the BLDC motor having a "Y" formation as shown in FIG. 1 in order to control motor speed and motor torque. Furthermore, the BLDC motor 130 may use three hall-effect sensors not shown in FIG. 1 to indicate a rotor position. The rotor itself uses several pairs of permanent magnets to generate the magnetic flux.

Hence, a power supply control circuit for a BLDC that uses a procedure for measuring the input DC current consumption $I_S$ for the control algorithm other than using shunt resistors in the DC link and thus avoids additional power consumption and heat dissipation and maximizes the performance of the motor-control system is desired.

SUMMARY

It is an object of the present disclosure to provide a BLDC power supply control circuit that can measure the DC current consumption of the motor $I_S$ without the requirement of establishing shunt resistors 101, 102 in the DC link of the power supply in contrast to current implementations. In this respect, a measured phase current signal can be adequately processed in order to obtain the desired DC current consumption that can be used as input for a control algorithm implemented by a microcontroller of the power supply control circuit. Therefore, the proposed control circuit avoids additional power consumption ($\Delta P_{diss} = I_s^2 \cdot R_{shunt}$), heat dissipation and PCB occupation related to shunt resistors located in the DC link and maximizes the performance of the motor-control system. Furthermore, by getting rid of shunt resistors, in particular, shunt resistor 101 the addition of complex circuitry to measure a differential voltage value can also be avoided. Moreover, getting rid of the shunt resistors 101, 102 may permit to ease the routing of conductive traces on a PCB supporting the control circuit.

Hence, according to an aspect of the present disclosure, a power supply control circuit for a three-phase brushless DC (BLDC) includes means for calculating a DC current consumption $I_S$ based on a phase current signal $I_{shunt}$ of the BLDC motor. The calculated DC current consumption $I_S$ may be used by a control algorithm for controlling the BLDC motor control or reported to a master controller for performing additional actions as, e.g., overcurrent protection.

Hence, the means for calculating a DC current consumption $I_S$ in the power supply control circuit comprises a shunt resistor $R_{shunt}$ for phase current sensing having a voltage $V_{shunt}$ that corresponds to a total phase current signal $I_{shunt}$ of the three phase BLDC motor across the shunt resistor $R_{shunt}$. In particular, the shunt resistor $R_{shunt}$ can be used to perform low-side phase current sensing as shown in FIGS. 2 and 3. In this regard, low-side phase sensing allows for easier determination of the motor phase currents, but it is not an exact equivalent, an error is potentially introduced relative to the true phase current. Low-side phase sensing also introduces a ground variation of the motor relative to system ground.

Furthermore, the means for calculating a DC current consumption $I_S$ in the power supply control circuit comprises an amplifier to amplify the input voltage $V_{shunt}$ and perform an offset correction of the input voltage $V_{shunt}$. The power supply control circuit also comprises a low pass filter to filter the amplified voltage signal $V_{shunt}$ to obtain a filtered output voltage $V_O$. The filtered output voltage $V_O$ may be fed into an analogue to digital converter (ADC) (which may or may not be included into the microcontroller itself) to calculate the input DC current consumption $I_S$ from the voltage $V_O$ value.

Hence, the DC current consumption of the BLDC motor $I_S$ can be obtained according to the following equation:

$$I_S = \frac{V_O}{K} \qquad \text{Equation 1}$$
$$K = R_{shunt} * \text{Gain}$$

Where Gain is the amplification factor of the amplifier to amplify the input voltage $V_{shunt}$.

Thus, shunt resistors 101, 102 used to measure the DC current consumption of the BLDC motor $I_S$ as shown in FIG. 1 are avoided.

According to another aspect of the present disclosure, a further example of a power supply control circuit for a BLDC includes means for calculating a DC current consumption $I_S$. The power supply control circuit uses means for performing phase current sensing. The means comprises three shunt resistors, e.g., $R_{Sh1}$, $R_{Sh2}$, and $R_{Sh3}$. The means of the power supply control circuit also comprises means for shunt signal amplification and offset correction, means for summation of the three shunt signals and low-pass signal filter.

Hence, it is proposed an alternative BLDC motor power supply control circuit comprising means for calculating the DC current consumption $I_S$ based on three phase current signals $I_{Sh1}$, $I_{Sh2}$, and $I_{Sh3}$ of the BLDC motor.

Hence, the means of the power supply control circuit according to the second aspect of the present disclosure comprises three shunt resistors $R_{Sh1}$, $R_{Sh2}$, and $R_{Sh3}$ for the three phases of the BLDC motor. Furthermore, the means of the power supply control circuit comprises three amplifiers to amplify three measured voltage signals $V_{Sh1}$, $V_{Sh2}$, and $V_{Sh3}$ corresponding to the phase current signals $I_{Sh1}$, $I_{Sh2}$, and $I_{Sh3}$ of the BLDC motor across the shunt resistors $R_{Sh1}$, $R_{Sh2}$, and $R_{Sh3}$, respectively and perform an offset correction of the voltages $V_{Sh1}$, $V_{Sh2}$, and $V_{Sh3}$. The total phase current signal can be calculated as $I_{ShT} = I_{Sh1} + I_{Sh2} + I_{Sh3}$.

The means of the power supply control circuit further comprises a summing amplifier to sum the three voltage signals $V_{Sh1}$, $V_{Sh2}$, and $V_{Sh3}$ and a low pass filter that filters $V_{ShT}$ and obtains an output voltage $V_O$. Therefore $V_{ShT} = V_{Sh1} V_{Sh2} V_{Sh3}$.

Hence, the DC current consumption of the BLDC motor $I_S$ can be obtained according to the following equation:

$$I_S = \frac{V_O}{K} \qquad \text{Equation 2}$$
$$K = R_{Total} * \text{Gain}_{Total}$$

The $\text{Gain}_{Total}$ represents the total amplification factor of the three amplifiers to amplify three measured voltage signals $V_{Sh1}$, $V_{Sh2}$, and $V_{Sh3}$.

The $R_{Total}$ is the equivalent resistance of $R_{Sh1}$, $R_{Sh2}$, and $R_{Sh3}$:

$$R_{Total} = \frac{1}{\frac{1}{R_{Sh1}} + \frac{1}{R_{Sh2}} + \frac{1}{R_{Sh3}}}$$

In some examples, the power supply control circuit comprises an AC filter comprising a capacitor and an inductance as shown in the figures.

According to another aspect of the disclosure, a method for calculating a DC current consumption $I_S$ of a three phase brushless DC (BLDC) motor is provided. The method is performed by the motor microcontroller of the power supply control circuit. The method comprises a step for amplifying a voltage signal V shunt corresponding to a total phase current signal $I_{shunt}$ of the BLDC motor across a shunt resistor $R_{shunt}$. The shunt resistor $R_{shunt}$ can measure low-side phase current. The method comprises a step for performing an offset correction of the voltage signal $V_{shunt}$. The method further comprises a step for obtaining an output voltage $V_O$ by low-pass filtering the amplified voltage signal $V_{shunt}$. Finally, the method comprises a step for obtaining the DC current consumption $I_S$ based on the output voltage $V_O$ and according to equation 1. In an example, the motor microcontroller can be configured to implement a control algorithm for controlling the BLDC motor based at least on the calculated $I_S$. In another example, a master controller may use the calculated $I_S$ for performing, e.g., overcurrent protection.

According to another aspect of the disclosure, a second method for calculating a DC current consumption $I_S$ of a three phase brushless DC (BLDC) motor is provided, the method is also performed by the motor microcontroller of the power supply control circuit. The method comprises a step for amplifying three voltage signals $V_{Sh1}$, $V_{Sh2}$ and $V_{Sh3}$ corresponding to three phase current signals $I_{Sh1}$, $I_{Sh2}$, $I_{Sh3}$ of the BLDC motor across shunt resistors $R_{Sh1}$, $R_{Sh2}$, and $R_{Sh3}$, respectively. In particular, the shunt resistors can measure low-side phase currents. The method comprises a step for performing offset correction of the three voltage signals $V_{Sh1}$, $V_{Sh2}$, and $V_{Sh3}$. The method comprises obtaining a total tension $V_{ShT}$ by summing the three voltage signals $V_{Sh1}$, $V_{Sh2}$, and $V_{Sh3}$ and obtaining a filtered voltage $V_0$ by low-pass filtering the total tension $V_{ShT}$. Finally, the DC current consumption $I_S$ is obtained based on the output voltage $V_O$ and according to the equation 2.

BRIEF DESCRIPTION OF THE DRAWINGS

The disclosure will now be described with reference to the drawings wherein.

DESCRIPTION OF EXEMPLARY EMBODIMENTS

For a better understanding the above description and for the sole purpose of providing an example, some non-limiting drawings are included that schematically depict exemplary embodiments.

Figure 1:
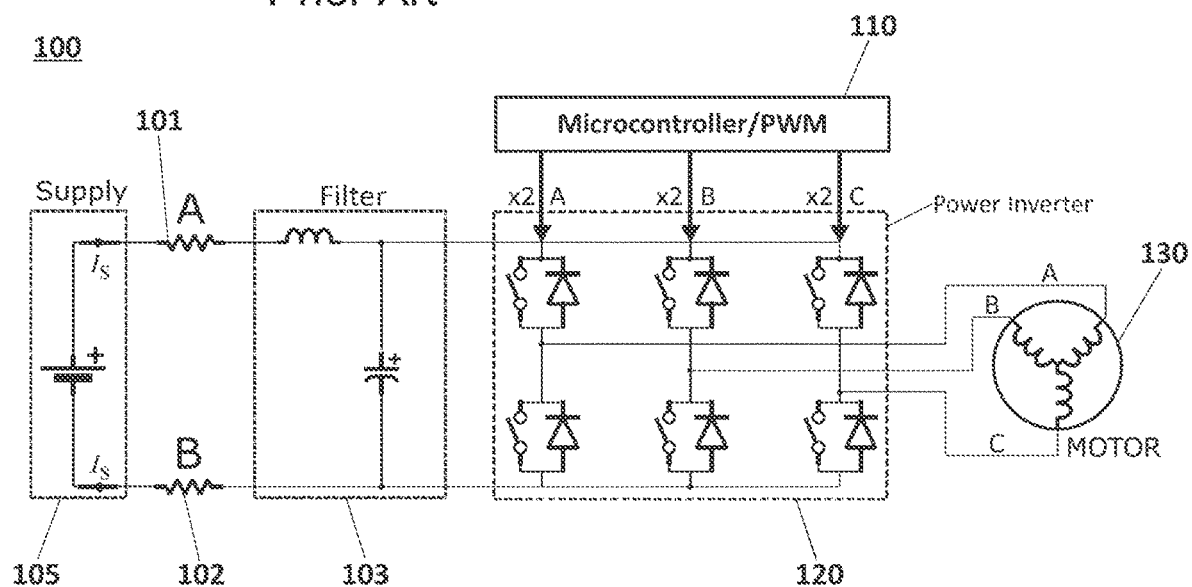
FIG. 1 shows a conventional BLDC power supply control circuit.
Figure 2:
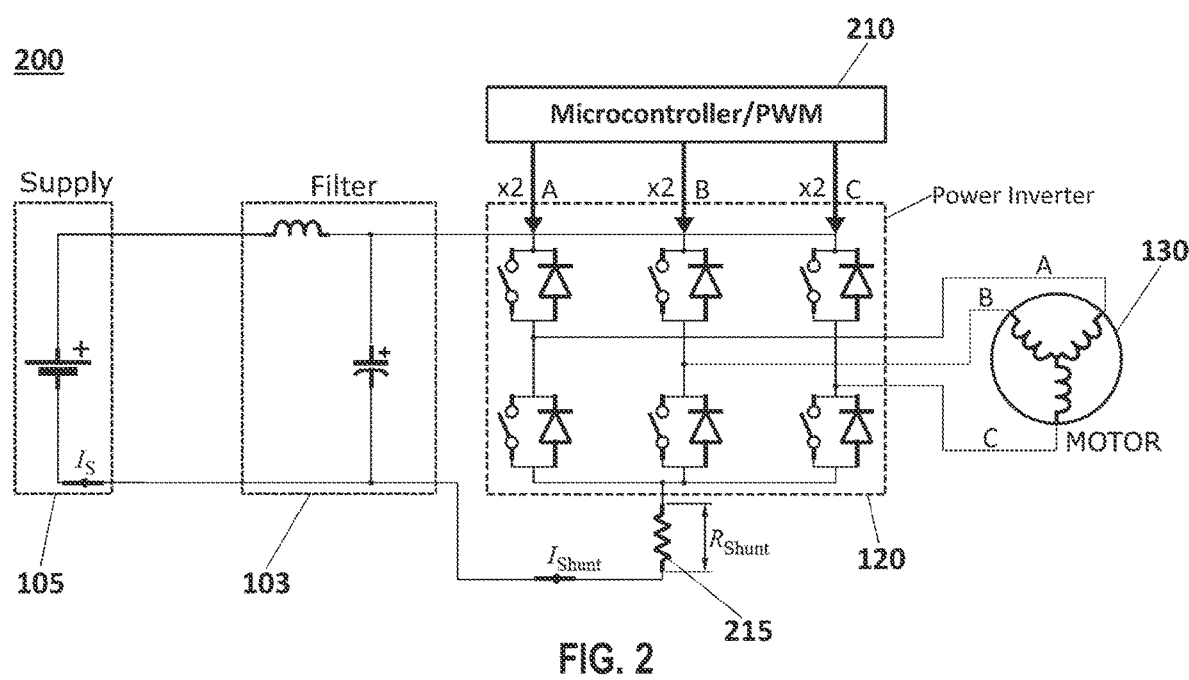
FIG. 2 shows of a BLDC power supply control circuit according to a first exemplary embodiment of the present disclosure.
Figure 4:
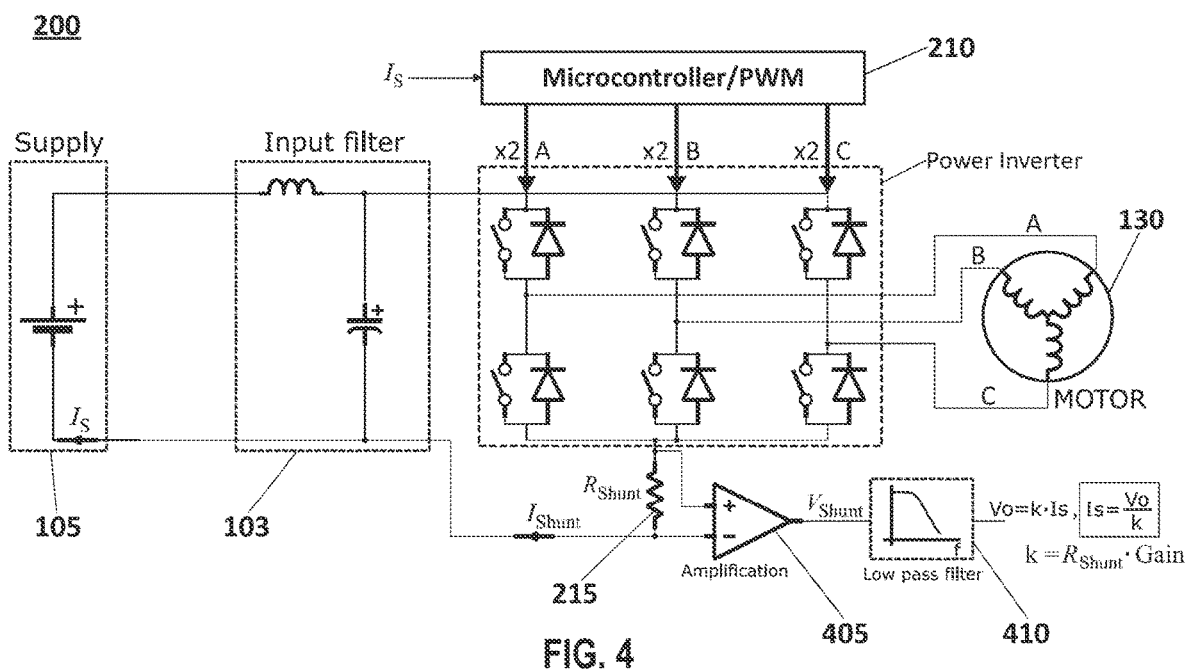
FIG. 4 shows the BLDC power supply control circuit according to the first exemplary embodiment of the present disclosure.

FIG. 2 shows a power supply control circuit 200 for a BLDC 130 having a "Y" formation. In another example, the BLDC 130 can have a "Delta" formation. The advantages of the configuration of the power supply control circuit 200 are cost reduction, the PCB area for placement of the control circuit is smaller compared to other configurations. Furthermore, one single ADC converters is needed. The control circuit 200 comprises a microcontroller/PWM control block 210 that generates a PWM signal for a power inverter 120 which produces an AC electric current that feeds the BLDC motor 130. The microcontroller/PWM block 210 controls current in the brushless DC motor 130 based on a control algorithm implemented by the microcontroller. The control circuit 200 comprises means for calculating a DC current consumption $I_S$ based on a phase current signal shunt of the BLDC motor, the means comprises a $R_{shunt}$ 215 for measuring low-side current sensing and an input AC filter 103. In order to obtain the DC current consumption $I_S$, the voltage $V_{shunt}$ corresponding to the current $I_{shunt}$ across $R_{shunt}$ 215 is measured, amplified, offset corrected and filtered as shown in FIG. 4. The DC current consumption $I_S$ is calculated according to equation 1.

Figure 3:
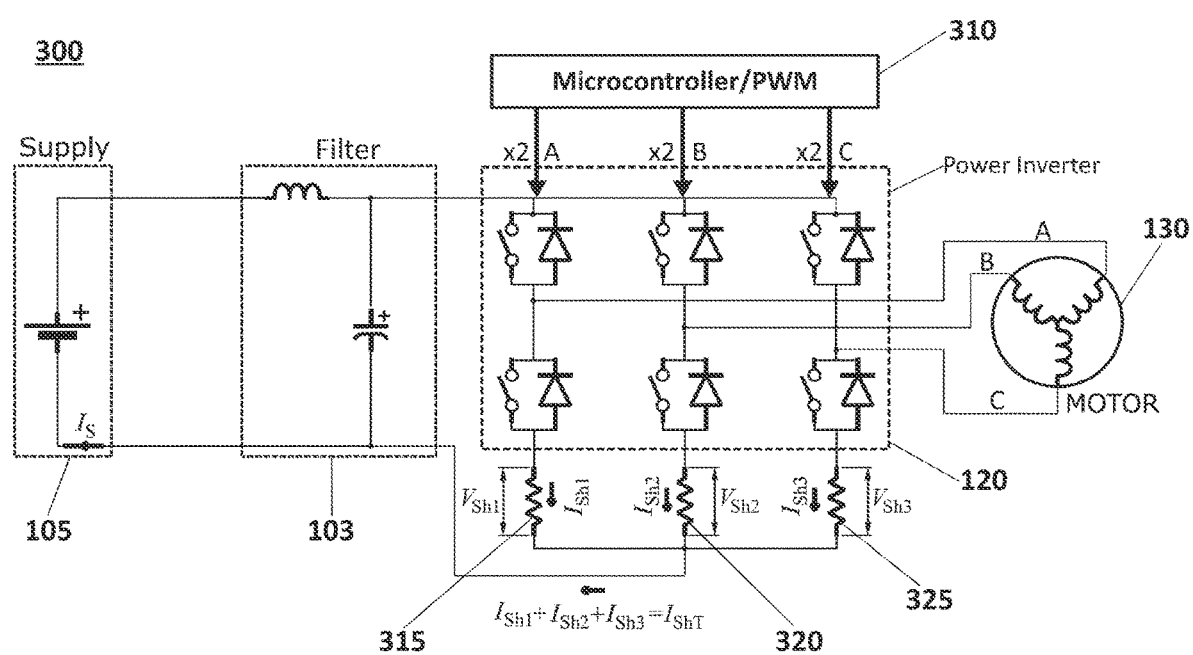
FIG. 3 shows a BLDC power supply control circuit according to a second exemplary embodiment of the present disclosure.
Figure 5:
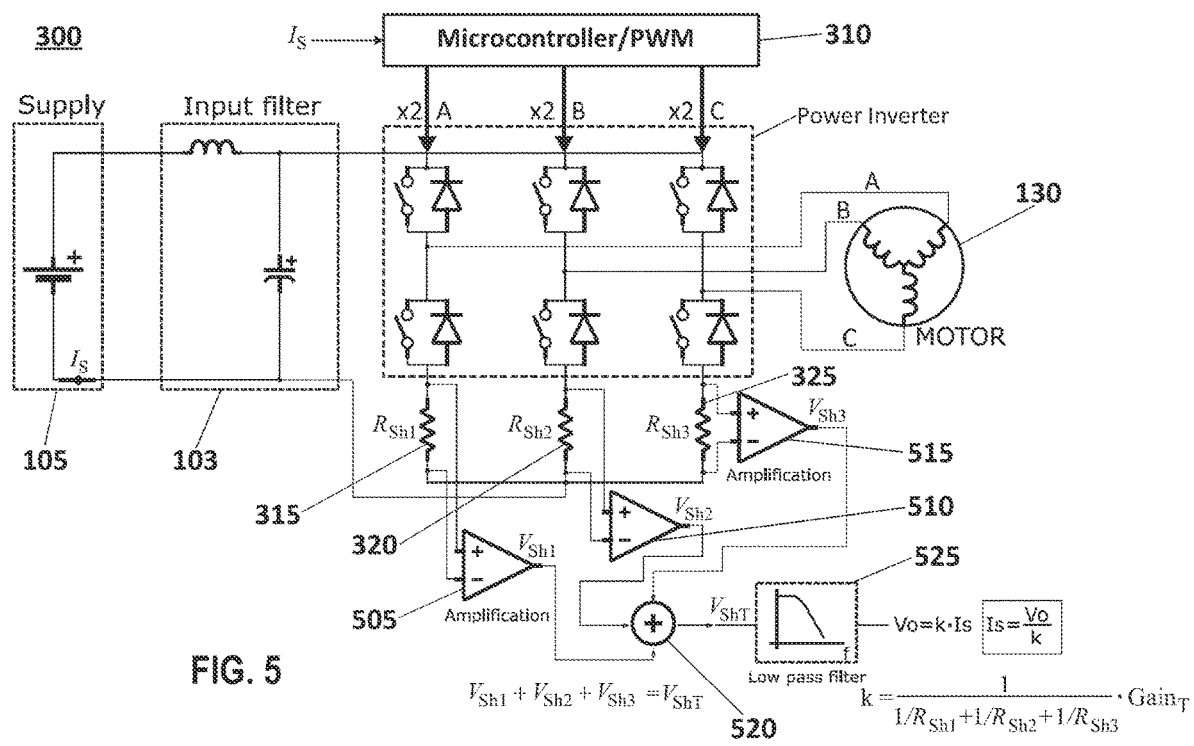
FIG. 5 shows the BLDC power supply control circuit according to the second exemplary embodiment of the present disclosure.

FIG. 3 shows a power supply control circuit 300 for the BLDC 130. The advantages of the configuration of the power supply control circuit 300 are that this configuration can obtain more precise phase currents readings and involve less acoustic noise and less total harmonic distortion (THD). Hence, the control algorithm can be improved when calculated DC current consumption $I_S$ is used to implement the control algorithm. The control circuit 300 comprises a microcontroller/PWM generator control block 310 that generates six PWM signals for the power inverter 120 that feeds the DC motor 130. The microcontroller/PWM generator block 310 controls current in the brushless DC motor 130 based on the control algorithm. In some examples, the DC current consumption $I_S$ of the BLDC motor 130 can be used as input to the control algorithm. The control circuit 300 comprises means for calculating the DC current consumption $I_S$ based on a phase current signal $I_{ShT}I_{shunt}$) the means comprises a three shunt resistors $R_{Sh1}$, $R_{Sh2}$, and $R_{Sh3}$ for measuring each phase current and an input AC filter 103. In order to obtain the DC current consumption $I_S$, three voltages $V_{Sh1}$, $V_{Sh2}$, and $V_{Sh3}$ are measured that correspond to the currents $I_{Sh1}$, $I_{Sh2}$, and $I_{Sh3}$ across the three shunt resistors $R_{Sh1}$, $R_{Sh2}$ and $R_{Sh3}$, respectively. The total phase current signal can be calculated as $I_{ShT}=I_{Sh1} I_{Sh2} I_{Sh3}$. Furthermore, the three voltages $V_{Sh1}$, $V_{Sh2}$, and $V_{Sh3}$ are amplified, offset corrected, summed, and filtered as shown in FIG. 5. The DC current consumption $I_S$ is calculated according to equation 2.

FIG. 4 shows the control circuit 200 previously shown in FIG. 2 comprising means for calculating a DC current consumption $I_S$, the means comprises signal processing elements to obtain the DC current consumption $I_S$ of the BLDC motor 130. In this example, the DC current consumption $I_S$ can be used as input for the microcontroller/PWM block 210 as shown in the figure. These signal processing elements comprise an amplifier 405 to amplify the voltage $V_{shunt}$ and perform an offset correction and a low pass filter 410 to filter the voltage signal $V_{shunt}$ from the amplifier 405. Hence, an output voltage $V_O$ is obtained from the low pass filter 410 and the DC current consumption of the BLDC motor $I_S$ is obtained based on said voltage $V_O$ and according to the equation 1.

FIG. 5 shows the control circuit 300 previously shown in FIG. 3 further comprising means for calculating a DC current consumption $I_S$, the means comprises signal processing elements to obtain the DC current consumption $I_S$ of the BLDC motor 130. In this example, the DC current consumption $I_S$ can also be used as input for the microcontroller/PWM block 310 as in FIG. 4. As previously mentioned, the means for calculating a DC current consumption $I_S$ comprises three shunt resistors $R_{Sh1}$, $R_{Sh2}$, and $R_{Sh3}$. The signal processing elements comprise three amplifiers 505, 510, and 515 to amplify three measured voltage levels $V_{Sh1}$, $V_{Sh2}$, and $V_{Sh3}$ corresponding to the shunt resistors $R_{Sh1}$, $R_{Sh2}$, and $R_{Sh3}$, respectively, and to perform an offset correction of the voltage levels. Furthermore, the signal processing elements comprise a summation module as, e.g., a summing amplifier (not drawn in the figure) but represented by reference 520 to obtain a total voltage $V_{ShT}=V_{Sh1} V_{Sh2} V_{Sh3}$. A low pass filter is also included as part of the control circuit 300 to filter the total voltage $V_{ShT}$ in order to obtain an output voltage $V_O$. Finally, the DC current consumption of the BLDC motor $I_S$ is obtained based on said voltage $V_O$ and according to the equation 2.

Even though reference has been made to exemplary embodiments of the disclosure, it is obvious for a person skilled in the art that the BLDC power supply control circuit architectures described herein are susceptible to numerous variations and modifications, and that all the details mentioned can be substituted for other technically equivalent ones without departing from the scope of protection defined by the attached claims.

What is claimed is:

1. A power supply control circuit of a three-phase brushless DC (BLDC) motor, the power supply control circuit comprising:
an electrical network for calculating the DC current consumption $I_S$ based on three phase currents $I_{Sh1}$ $I_{Sh2}$ and $I_{Sh3}$ of the BLDC motor;
the electrical network comprising:
three shunt resistors $R_{Sh1}$, $R_{Sh2}$, and $R_{Sh3}$;
three amplifiers;
a single summing amplifier; and
a low pass filter,
wherein the three amplifiers are configured to amplify and perform an offset correction of three voltages $V_{Sh1}$, $V_{Sh2}$, and $V_{Sh3}$ that correspond to the three phase currents $I_{Sh1}$, $I_{Sh2}$, and $I_{Sh3}$ across the three shunt resistors $R_{Sh1}$, $R_{Sh2}$, and $R_{Sh3}$, respectively, wherein the single summing amplifier is configured to sum the three voltages $V_{Sh1}$, $V_{Sh2}$, and $V_{Sh3}$ to generate a total voltage $V_{ShT}$, wherein the three voltages $V_{Sh1}$, $V_{Sh2}$, and $V_{Sh3}$ represent direct input values of the single summing amplifier, wherein the low pass filter is configured to provide a filtered voltage $V_O$ of the voltage $V_{ShT}$, and wherein the DC current consumption of the BLDC motor $I_S$ is calculated according to the following equation:

$$I_S = \frac{V_O}{K}$$

wherein K=$R_{Total}$*$Gain_{Total}$, $R_{Total}$ is the equivalent resistance of resistors $R_{Sh1}$, $R_{Sh2}$, and $R_{Sh3}$, and wherein $Gain_{Total}$ is the total amplification factor of the three amplifiers.

2. The power supply control circuit according to claim 1, further comprising an AC filter.

3. A method for calculating a DC current consumption $I_S$ of a three-phase brushless DC (BLDC) motor, the method being performed by a microcontroller of a power supply control circuit of the BLDC motor, the method comprising:
 amplifying three voltages $V_{Sh1}$, $V_{Sh2}$, and $V_{Sh3}$ corresponding to three phase currents $I_{Sh1}$, $I_{Sh2}$, and $I_{Sh3}$ of the BLDC motor across three shunt resistors $R_{Sh1}$, $R_{Sh2}$, and $R_{Sh3}$ for phase current sensing, respectively;
 performing an offset correction of the three voltages $V_{Sh1}$, $V_{Sh2}$, and $V_{Sh3}$;
 obtaining a total voltage $V_{ShT}$ by summing the three voltages $V_{Sh1}$, $V_{Sh2}$, and $V_{Sh3}$ with a single summing filter, wherein the three voltages $V_{Sh1}$, $V_{Sh2}$, and $V_{Sh3}$ represent direct input values of the single summing amplifier;
 obtaining a filtered voltage $V_O$ by low-pass filtering the total voltage $V_{ShT}$; and
 calculating the DC current consumption $I_S$, according to the following equation:

$$I_S = \frac{V_O}{K}$$

wherein K=$R_{Total}$*$Gain_{Total}$, wherein $R_{Total}$ is the equivalent resistance of the three shunt resistors $R_{Sh1}$, $R_{Sh2}$, and $R_{Sh3}$, and wherein $Gain_{Total}$ is the total amplification factor of the three amplifiers.

4. The method according to claim 3, further comprising implementing a control algorithm for controlling the BLDC motor based at least on the calculated $I_S$.

* * * * *